(12) United States Patent
Liu et al.

(10) Patent No.: US 7,183,199 B2
(45) Date of Patent: Feb. 27, 2007

(54) METHOD OF REDUCING THE PATTERN EFFECT IN THE CMP PROCESS

(75) Inventors: Chi-Wen Liu, Hsinchu (TW); Jung-Chih Tsao, Taipei (TW); Shien-Ping Feng, Taipei (TW); Kei-Wei Chen, Taipei (TW); Shih-Chi Lin, Taipei (TW); Ray Chuang, Taipei (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 101 days.

(21) Appl. No.: 10/724,201

(22) Filed: Dec. 1, 2003

(65) Prior Publication Data
US 2005/0118808 A1    Jun. 2, 2005

(51) Int. Cl.
*H01L 21/4763* (2006.01)
(52) U.S. Cl. .................. 438/633; 438/626; 438/692
(58) Field of Classification Search ........ 438/622–640, 438/690–692, 697, 699, 687, 688
See application file for complete search history.

(56) References Cited

U.S. PATENT DOCUMENTS

| 6,251,786 B1 | 6/2001 | Zhou et al. |
| 6,461,225 B1 | 10/2002 | Misra et al. |
| 2004/0058620 A1* | 3/2004 | Gotkis et al. ................. 451/5 |
| 2004/0067640 A1* | 4/2004 | Hsu et al. ................... 438/637 |

* cited by examiner

*Primary Examiner*—Thanhha Pham
(74) *Attorney, Agent, or Firm*—Birch, Stewart, Kolasch & Birch, LLP

(57) ABSTRACT

A method of reducing the pattern effect in the CMP process. The method comprises the steps of providing a semiconductor substrate having a patterned dielectric layer, a barrier layer on the patterned dielectric layer, and a conductive layer on the barrier layer; performing a first CMP process to remove part of the conductive layer before the barrier layer is polished, thereby a step height of the conductive layer is reduced; depositing a layer of material substantially the same as the conductive layer on the conductive layer; and performing a second CMP process to expose the dielectric layer. A method of eliminating the dishing phenomena after a CMP process and a CMP rework method are also provided.

7 Claims, 10 Drawing Sheets

METHOD OF REDUCING THE PATTERN EFFECT IN THE CMP PROCESS

BACKGROUND OF THE INVENTION

1. Field of the Invention

The present invention relates in general to a chemical mechanical polishing (CMP) process in semiconductor manufacturing. In particular, the present invention relates to a method of reducing the pattern effect in a CMP process, a method of eliminating the dishing phenomena after a CMP process, and a CMP rework method.

2. Description of the Related Art

Chemical mechanical polishing (CMP) has been popularly applied to the planarization treatment of conductive wires in logic device processing and contact window processing, and especially, to the fabrication of sub-130 nm interconnects in ultra-large scale integration (ULSI) silicon device. With respect to a damascene technique, the desired process requires removal of the metal (such as copper) overburden followed by the over-polishing to ensure that all residual copper is completely removed. However, during the CMP process, if an area ratio of the conductive wire to the insulating layer is too large, a pattern effect arises, resulting in the phenomenon known as "dishing". As shown in FIG. 1, when performing a CMP process on a conductive wire 103 of a large pattern area, polishing rates of the conductive wire 103 and an insulating layer 101 are different, as a result, the center area of the conductive wire 103 exhibits a severe dishing effect as shown by a dotted line 104. As the dishing phenomenon occurs, sheet resistance ($R_S$) varies, and as a result the electrical properties deteriorate. Therefore, the pattern effect is undesirable.

During a CMP process, a substrate is subject to three polishing stages for, as is shown in FIGS. 2a to 2d. The planarization stage denoted by "P" shown in FIG. 2a begins with polishing and ends when the copper layer surface becomes substantially planar. The transition stage denoted by "T" shown in FIG. 2a begins after the copper layer surface is substantially planar and ends when the dishing phenomenon begins. The duration of the transition stage is often very short. The dishing stage denoted by "D" shown in FIG. 2a begins when the dishing phenomenon first occurs until the end-point is detected by the CMP device. FIG. 2b shows a schematic view of a general substrate profile at the beginning of a CMP process, that is, at the beginning of the planarization stage. There is an original step height which gradually decreases as the substrate is polished. FIG. 2c shows a schematic view of the general substrate profile near the beginning of the transition stage. The surface of the substrate is almost planar but the dielectric layer has not been exposed, thus polishing continues. The transition stage can act as the operating window for a polishing machine. This stage is very short and when the polishing approaches and reaches the interface between the conductive layer and the dielectric layer, the polishing machine receives an end-point signal and stops. The substrate, however, is often at the dishing stage, as shown in FIG. 2d, and exhibits a serious dishing phenomenon caused by the pattern effect.

Furthermore, the end-point for polishing is often erroneously reached due to faulty signal collection. Generally, more than 20% polished wafers have end-point failure and become abnormal substrates reported by CMP machines. The conductive layer (for example, Cu) thickness is often incorrectly reported due to the narrow operating window, which results from the very short transition stage. This leads to additional complications in maintaining the desired metal topography and requires CMP rework for failed wafers. It is difficult, however, to find an adequate recipe to rework wafers because the under-polish levels of polished wafers are event-related. As more wafers require CMP rework, lower wafer yield is obtained. Thus, a transition stage of increased duration is desirable for improving the detection of end-point failure cases. In addition, the problems of the dishing phenomena caused by over polishing after a CMP process and the abnormal wafers reported by CMP machines need to be solved.

U.S. Pat. No. 6,461,225 B1 discloses a method of manufacturing an integrated circuit to avoid dishing of the copper, wherein copper is deposited inside the trench defined in a substrate, a copper alloy layer is formed over the surface of the copper wherein the copper alloy is of the formula Cu—M and M is selected from the group consisting of Ni, Zn, Si, Au, Ag, Al, Mn, Pd, Pb, Sn, or blends thereof, and the resulting structure is planarized. The copper layer is deposited to fill the trench at a level approaching the top surface of the underlying wafer, but not overfill the trench, and the deposition of copper alloy comprising metal other than copper increases the process complexity.

U.S. Pat. No. 6,251,786 B1 discloses a method of treating the surface of a copper dual damascene structure on the surface of a semiconductor substrate, thereby reducing the dishing effect and erosion of copper surfaces used in interconnect metal, wherein the copper surface of said dual damascene structure is polished and recessed down to the surface of the barrier layer, a thin film is deposited over the surface of said recessed dual damascene, and, part of said deposited thin film is then removed. The thin film, which contains $Si_3N_4$ or any other dielectric material, may cause the interconnect to have an increased electrical resistance.

Hence, there is a need for a better method to reduce the pattern effect in a CMP process, a method to eliminating the dishing phenomena, and a CMP rework method.

SUMMARY OF THE INVENTION

Accordingly, an object of the present invention is to provide a method of reducing the pattern effect in the CMP process.

According to the feature of the present invention, another object of the present invention is to provide a method of eliminating the dishing phenomena after a CMP process.

According to the feature of the present invention, still another object of the present invention is to provide a CMP rework method.

The method of reducing the pattern effect in the CMP process of the present invention comprises the steps of providing a semiconductor substrate having a patterned dielectric layer, a barrier layer over the patterned dielectric layer, and a conductive layer over the barrier layer; performing a first CMP process to remove part of the conductive layer before the barrier layer is polished, thereby reducing the step height of the conductive layer; depositing a layer of material substantially the same as the conductive layer over the conductive layer; and performing a second CMP process to expose the dielectric layer. The pattern effect in the CMP process is thus reduced.

An advantage of the present invention is that, by removing part of the conductive layer in the CMP process and re-depositing the conductive layer, the duration time of transition stage is increased, this in turn improves the end-point detecting function of the polishing machine and can effectively reduce the dishing phenomenon caused by the pattern effect in the CMP process, and the $R_S$ is improved.

According to the feature of the present invention, the method of eliminating the dishing phenomena after a CMP process comprises the steps of providing a semiconductor substrate having a patterned dielectric layer, a barrier layer over the patterned dielectric layer, and a conductive layer over the barrier layer; performing a first CMP process to a polishing end point to remove part of the conductive layer, wherein the dishing phenomena occur on the conductive layer; depositing a layer of material substantially the same as the conductive layer over the conductive layer; and performing a second CMP process to expose the patterned dielectric layer.

According to the feature of the present invention, the CMP rework method comprises the steps of providing a semiconductor substrate which is reported by a CMP machine as an abnormally polished wafer at a predetermined CMP end point and has a patterned dielectric layer, a barrier layer over the patterned dielectric layer, and a conductive layer over the barrier layer; depositing a layer of material substantially the same as the conductive layer over the conductive layer; and performing a CMP process to expose the patterned dielectric layer. The CMP rework method of the present invention can resolve the problems of serious dishing phenomena, sheet resistance variations, and low yields accompanied by conventional CMP rework methods.

Further scope of the applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings, which are given by way of illustration only, and thus are not limitative of the present invention, and wherein:

FIG. 6b shows schematic cross-section profiles of the corresponding substrate at the beginning of the planarization stage as shown in FIG. 6a;

FIG. 6c shows schematic cross-section profiles of the corresponding substrate near the beginning of the transition stage as shown in FIG. 6a;

FIG. 6e shows schematic cross-section profiles of the corresponding substrate at the end point of the polishing as shown in FIG. 6a.

DETAILED DESCRIPTION OF THE INVENTION

A preferred embodiment of the present invention is now described with reference to FIGS. 3a to 3d.

Figure 3A:
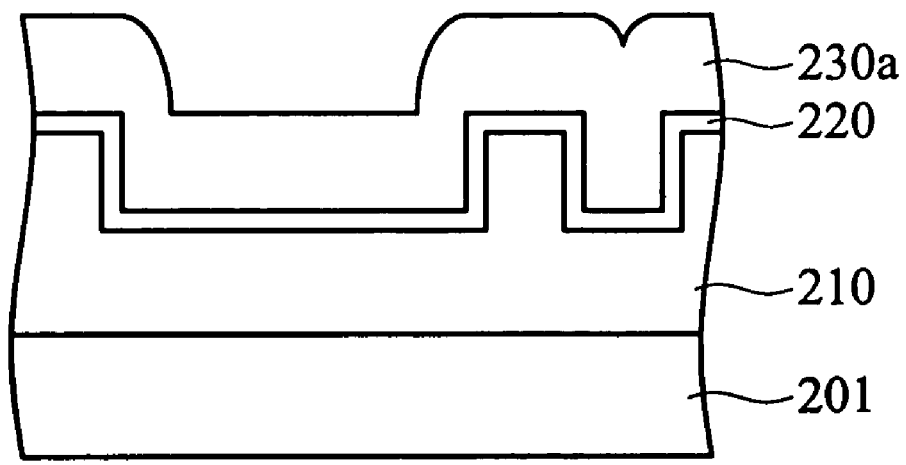
FIGS. 3a to 3d show a method of reducing the pattern effect in the CMP process according to the example of the present invention.

First, in FIG. 3a, a patterned dielectric layer 210 formed on a semiconductor substrate 201 is provided. The semiconductor substrate may contain a variety of elements, including, for example, transistors, diodes, and other semiconductor elements (not shown) as are well known in the art. The patterned dielectric layer 210 may comprise silicon dioxide, silicon nitride, phosphosilicate glass, borophosphosilicate glass, or other low dielectric constant material such as fluorosilicate glass.

A barrier layer 220 is formed conformally to cover the surface of the top, side wall and bottom of the patterned dielectric layer 210. The barrier layer 220 prevents diffusion of the conductive material following deposition, wherein the barrier layer 220 may be Ta, Ti, W, TaN, TiN, or WN.

A conductive layer 230a is formed on the barrier layer 220 using a well known deposition process, such as electroplating, CVD (chemical vapor deposition), and PVD (physical vapor deposition), filling the opening on the barrier layer 220. The conductive layer 230a can be metal, and is preferably copper. The surface of the deposited conductive layer is not planar and usually has a shape conforming to the shape of the underlying layer, resulting in various step heights on the surface.

Figure 3B:
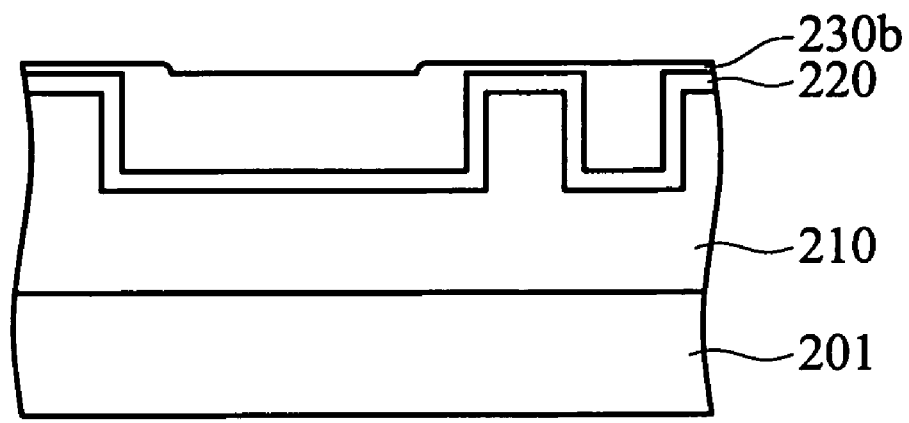

Next, in FIG. 3b, the conductive layer 230a is subjected to a first CMP process and partially removed, forming a conductive layer 230b. After the CMP process, the thickness of the remaining conductive layer is not limited as long as the top surface of the remaining conductive layer is higher than the barrier layer, so that neither the barrier layer 220 nor the patterned dielectric layer 210 is exposed, i.e. the barrier layer 220 is not polished. The top surface of the remaining conductive layer is higher than the barrier layer, preferably by more than 10 Å, and, more preferably, from about 100 Å to about 1000 Å. The layer 230b is substantially more planar than the layer 230a, and is preferably a planar surface.

Figure 3C:
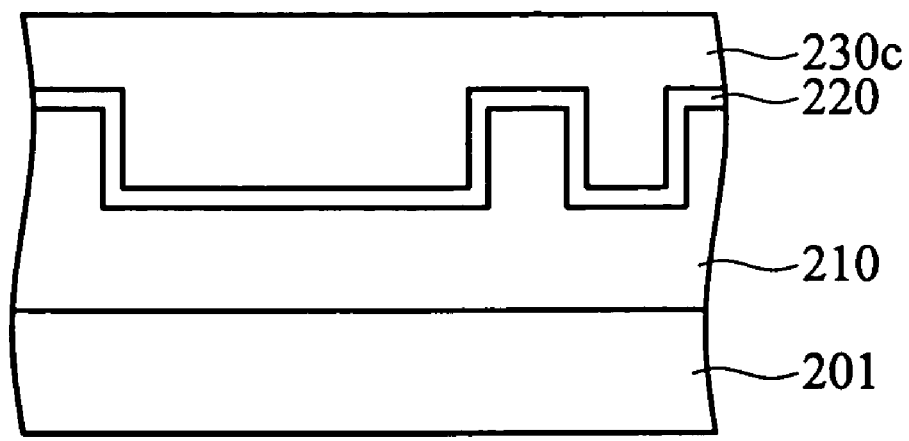
Figure 3D:
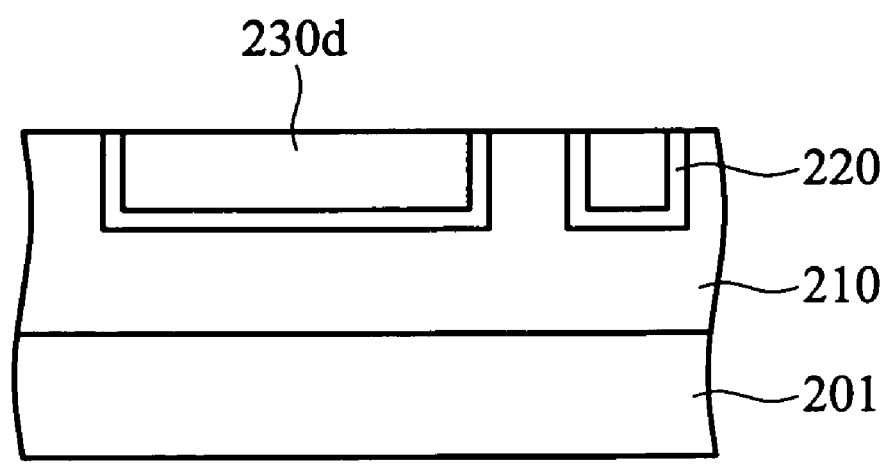

Then, in FIG. 3c, a layer of material substantially the same as the conductive layer is deposited over the conductive layer 230b, forming a conductive layer 230c thicker than layer 230b. The thickness of the re-deposited layer is not limited, and preferably 500 Å to 2000 Å. After the deposition, or it may be called re-deposition, the thickness of the substantially planar conductive layer is increased, thus the transition stage is extended, and in turn the operating window for the CMP machine is widened, allowing the polishing end-point of the following CMP process to be easily and correctly detected. The deposition process can be the same or different from that used in the deposition of the conductive layer 230a, such as electroplating, CVD, and PVD, for example. Use of the same process is preferable, because the same device is used for deposition.

Finally, a second CMP process is performed to expose the patterned dielectric layer; thereby the pattern effect in the CMP process is reduced and the resulting conductive layer has an improved planar surface and an improved $R_S$. Furthermore, the method allows polishing machines to have a wider operating window.

Figure 4A:
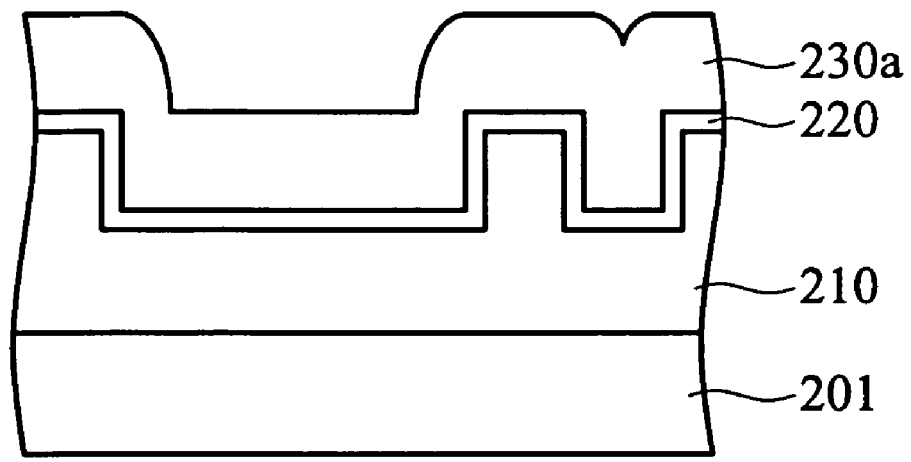
FIGS. 4a to 4d show a method of eliminating the dishing phenomena after a CMP process according to the present invention.

With respect to the method of eliminating the dishing phenomena after a CMP process of the present invention, a step of re-depositing a conductive layer is performed on a semiconductor substrate thereon dishing phenomena have occurred after a CMP process, and then a CMP process is performed to polish the semiconductor substrate to a correct end-point. The detail is described referring to FIGS. 4a to 4d. First, in FIG. 4a, a semiconductor substrate 201 is provided. The semiconductor substrate has a patterned dielectric layer 210, a barrier layer 220 on the patterned dielectric layer, and a conductive layer 230a on the barrier layer. The semiconductor substrate may contain a variety of elements, including, for example, transistors, diodes, and other semiconductor elements (not shown) as are well known in the art. The patterned dielectric layer 210 may comprise silicon dioxide, silicon nitride, phosphosilicate glass, borophosphosilicate glass, or other low dielectric constant material such as fluorosilicate glass. The barrier layer 220 may comprise Ta, Ti, TaN, TiN, or WN. The conductive layer 230a may comprise copper or copper alloy.

Figure 4B:
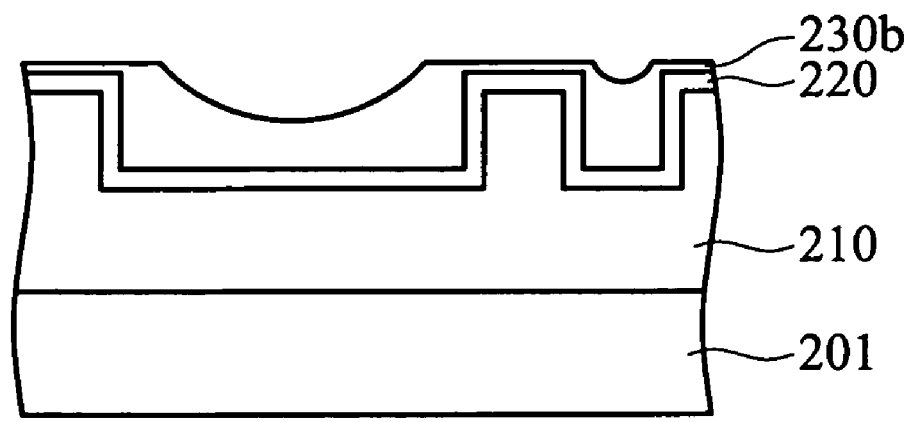

Next, in FIG. 4b, a first CMP process is performed on the conductive layer 230a to reach a polishing end-point according to the general definition to remove part of the conductive layer, forming a conductive layer 230b, but dishing phenomena occur. Preferably, the barrier layer 220 and the patterned dielectric layer have not been exposed, that is, the barrier layer 220 has not been polished.

Figure 4C:
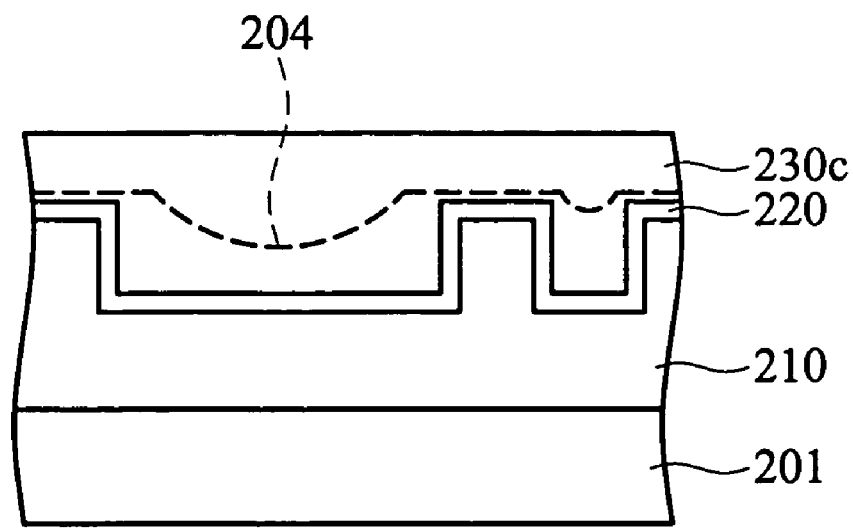

Next, in FIG. 4c, a layer of material substantially the same as the conductive layer is deposited over the conductive layer 230b, forming a conductive layer 230c thicker than layer 230b. The dotted line 204 in FIG. 4c shows the original surface of the conductive layer 230b in FIG. 4b. The thickness of the re-deposited layer is not limited, and, in general, the top surface should be higher than the top surface of the barrier layer, or the total thickness of the resulting conductive layer 230c is 6000 Å, or preferably 2000 to 4000 Å. After the deposition, or it may be called re-deposition, the thickness of the substantially planar conductive layer is increased, thus the transition stage is extended, and in turn the operating window for the CMP machine is widened, allowing the polishing end-point of the following CMP process to be easily and correctly detected. The deposition process can be the same as described above.

Figure 4D:
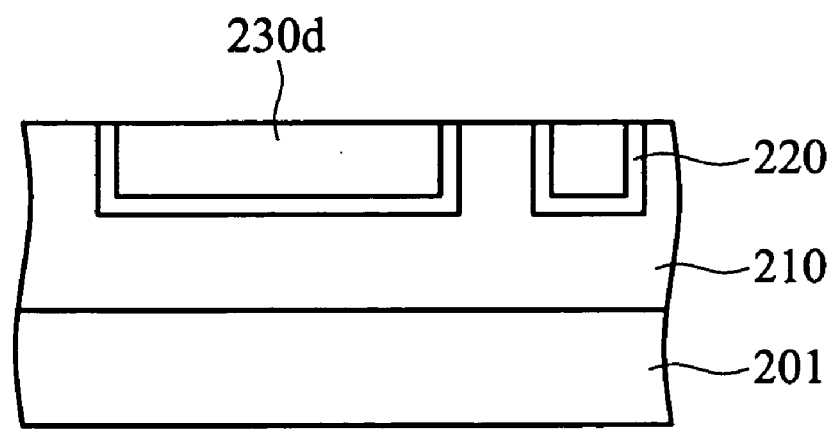

Finally, a second CMP process is performed to expose the patterned dielectric layer; thereby the dishing phenomena after CMP process are eliminated, obtaining a conductive layer having a planar surface and an improved $R_S$, referring to FIG. 4d.

Figure 5A:
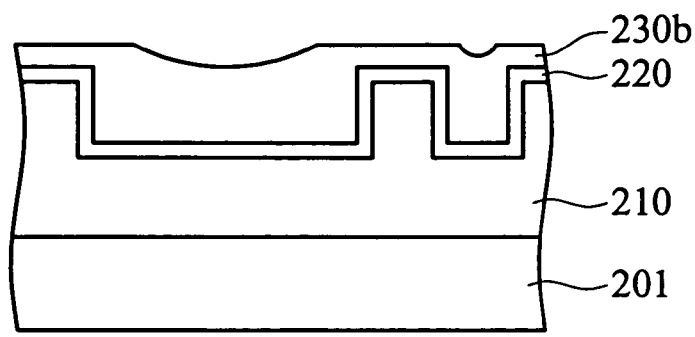
FIGS. 5a to 5c show a CMP rework method according to the present invention.

With respect to the CMP rework method of the present invention, an abnormal semiconductor substrate reported as failure by a CMP machine at the polishing end point is reworked. Such semiconductor substrate is at the state of under polishing for the conductive layer, and the correct polishing end point has not reached. The detail is described referring to FIGS. 5a to 5c. First, in FIG. 5a, a semiconductor substrate 201 which has been reported as an abnormally polished wafer by a CMP machine is provided. The semiconductor substrate has a patterned dielectric layer 210, a barrier layer 220 on the patterned dielectric layer, and a conductive layer 230a on the barrier layer. The semiconductor substrate may contain a variety of elements, including, for example, transistors, diodes, and other semiconductor elements (not shown) as are well known in the art. The patterned dielectric layer 210 may comprise silicon dioxide, silicon nitride, phosphosilicate glass, borophosphosilicate glass, or other low dielectric constant material such as fluorosilicate glass. The barrier layer 220 may comprise Ta, Ti, TaN, TiN, or WN. The conductive layer 230a may comprise copper or copper alloy. Because the provided semiconductor substrate has been polished by a CMP process and insufficiently polished, the top surface of the polished conductive layer 230b approximately approaches the interface of the barrier layer 220 and the conductive layer 230b.

Figure 5B:
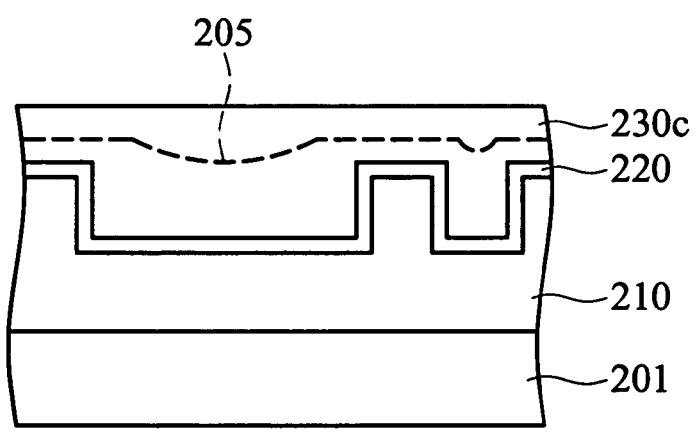

Next, in FIG. 5b, a layer of material substantially the same as the conductive layer is deposited over the conductive layer 230b, forming a conductive layer 230c thicker than layer 230b. The dotted line 205 in FIG. 5b shows the original surface of the conductive layer 230b in FIG. 5a. The thickness of the re-deposited layer is not limited, and, in general, the top surface should be higher than the top surface of the barrier layer, or the total thickness of the resulting conductive layer 230c is 6000 Å, or preferably 2000 to 4000 Å. After the deposition, or it may be called re-deposition, the thickness of the substantially planar conductive layer is increased, thus the transition stage is extended, and in turn the operating window for the CMP machine is widened, allowing the polishing end-point of the following CMP process to be easily and correctly detected. The deposition process can be the same as described above.

Figure 5C:
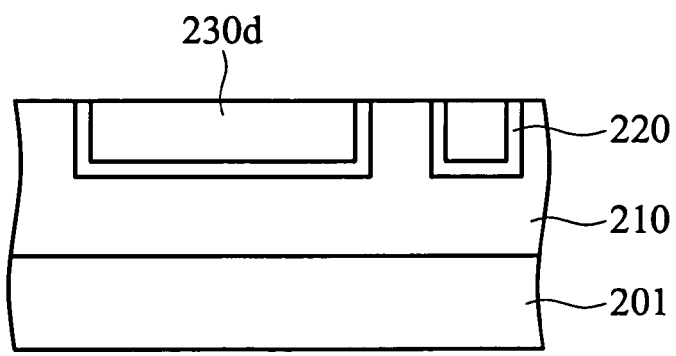
Figure 6A:
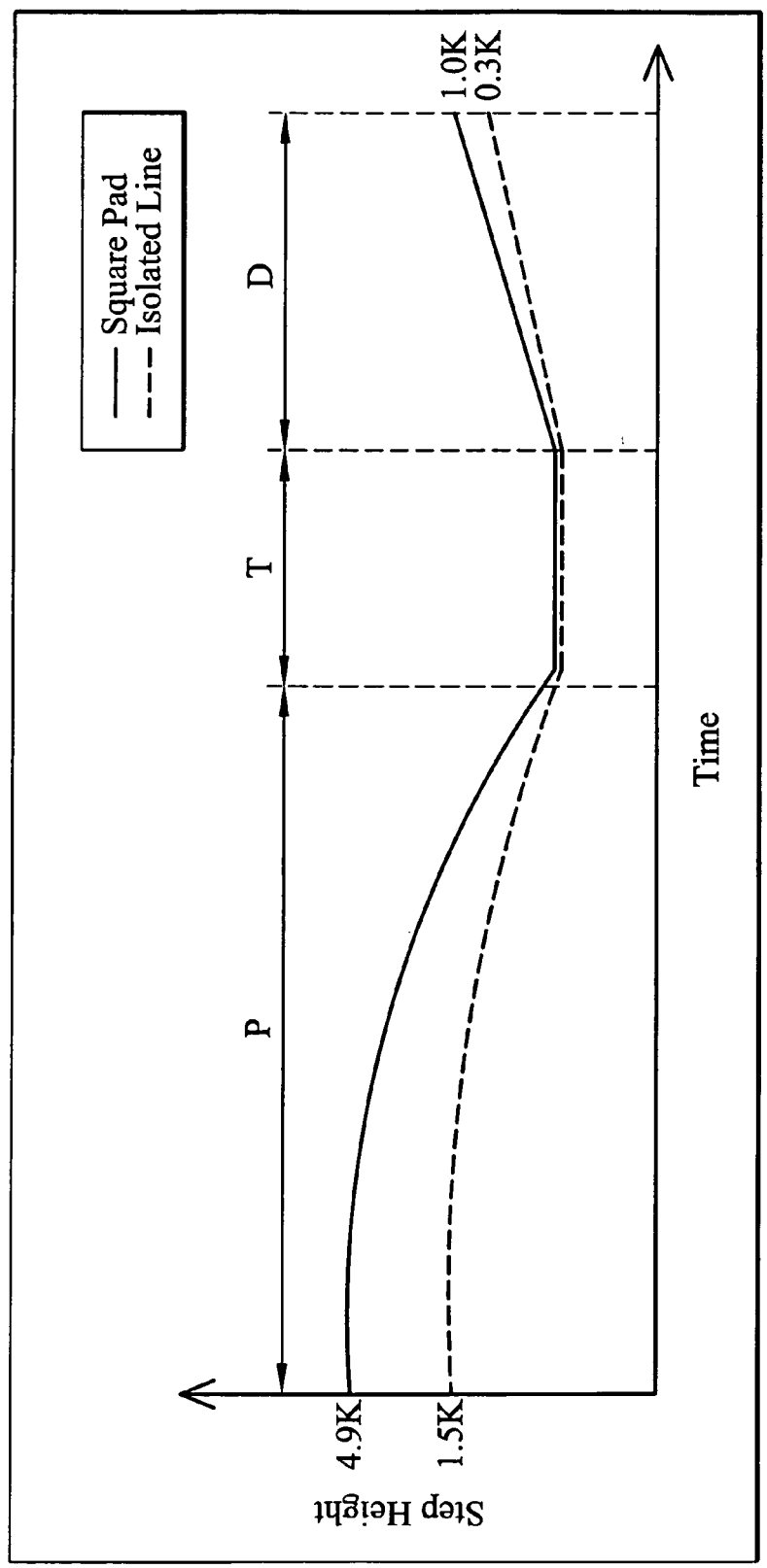
FIG. 6a is a schematic diagram showing the step height against the time during the CMP process of the example according to the method of the present invention.
Figure 6B:
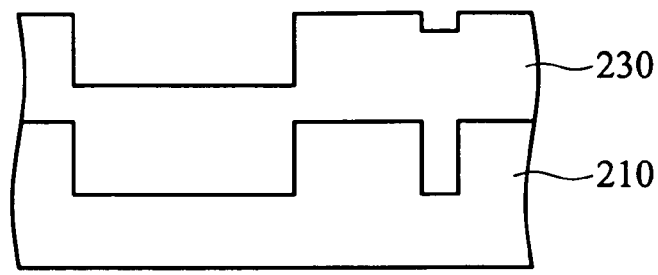
Figure 6C:
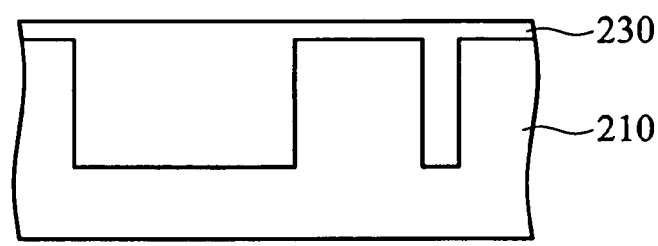
Figure 6D:
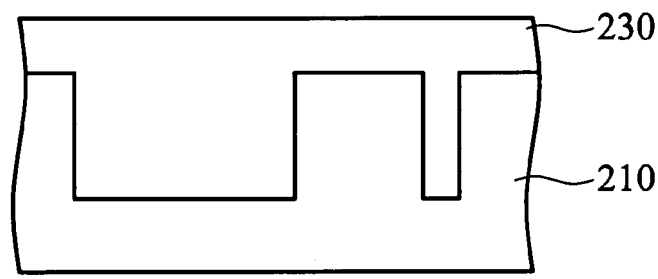
FIG. 6d shows schematic cross-section profiles of the corresponding substrate after the re-deposition of copper.
Figure 6E:
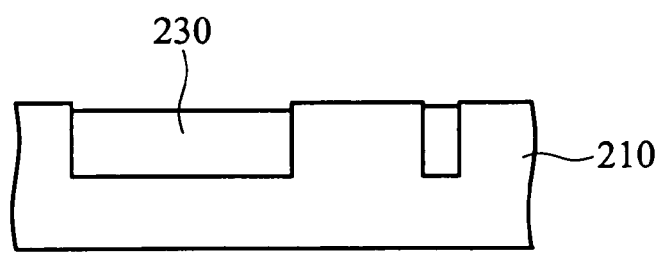

Finally, a CMP process is performed to expose the patterned dielectric layer; thereby accomplishing the CMP rework method of the present invention, referring to FIG. 5c. Thus, the abnormally reported semiconductor substrate is reworked, and a good recovery is obtained, resolving the problem of more than 20% of polished wafers reported by CMP machines as polishing-failed abnormal wafers at the polishing end point.

EXAMPLE

Example 1

The Method of Reducing the Pattern Effect in the CMP Process According to the Present Invention The example was performed using the method of reducing the pattern effect in the CMP process of the present invention mentioned above, wherein silicon dioxide was used as the patterned dielectric layer with trench patterns of squares (110×110 μm²) and isolated lines (5×350 μm²), TiN was used to form the barrier layer with a thickness of 250 Å±50 Å, a copper layer was deposited as a conductive layer by copper seeding and then electrochemical plating on the TiN barrier layer and had a thickness of 6000 Å±600 Å and average step heights of about 4900 Å for the square area and about 1500 Å for the isolated line area.

After the first CMP process was performed, the thickness of the remaining copper layer higher than the TiN barrier layer was about 4800 Å±480 Å and was approximately planar. Copper was re-deposited on the remaining copper layer by electrochemical plating to form an additional copper layer of 2000 Å. Then, the second CMP process was performed. At the end of the second CMP process, the average step heights were reduced, compared to the following comparative example, to be about 1000 Å for the square area and about 300 Å for the isolated line area, with an improvement of 39.6% and 30.8%, respectively.

Also referring to FIGS. 6a to 6e, the planarization stage began when the CMP process began. The substrate had the original profile as shown schematically in FIG. 6b and the step heights for the squares and isolation lines gradually decreased as the polishing continued. Then, the transition stage for CMP began when the surface of the copper layer (230) became approximately planar, as shown schematically in FIG. 6c, and the CMP process was stopped. Then, the copper layer was re-deposited, resulting in the substrate profile as shown schematically in FIG. 6d. Thus the transition stage was extended. Then the second CMP process began until a clear end-point signal was received by the polishing machine, resulting in a conductive layer with an improved planar surface, as shown schematically in FIG. 6e.

Comparative Example

Figure 1:
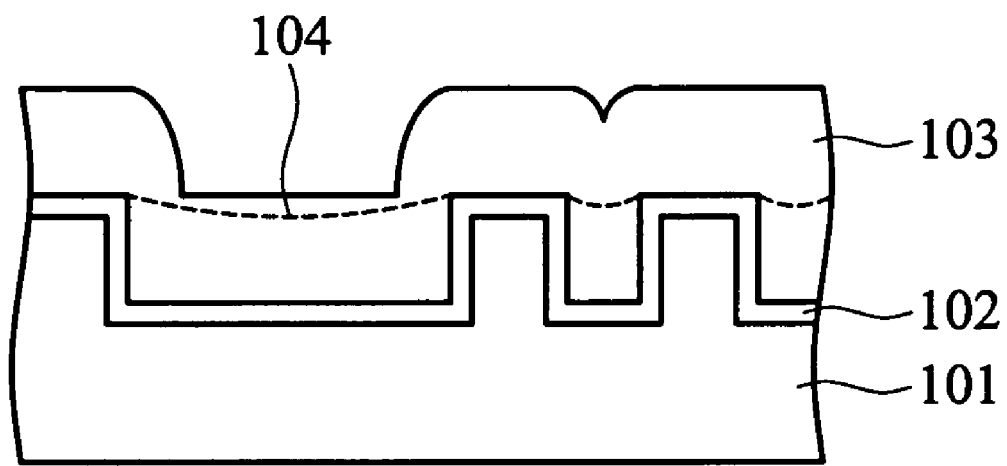
FIG. 1 shows dishing produced in the CMP process according to the prior art.
Figure 2A:
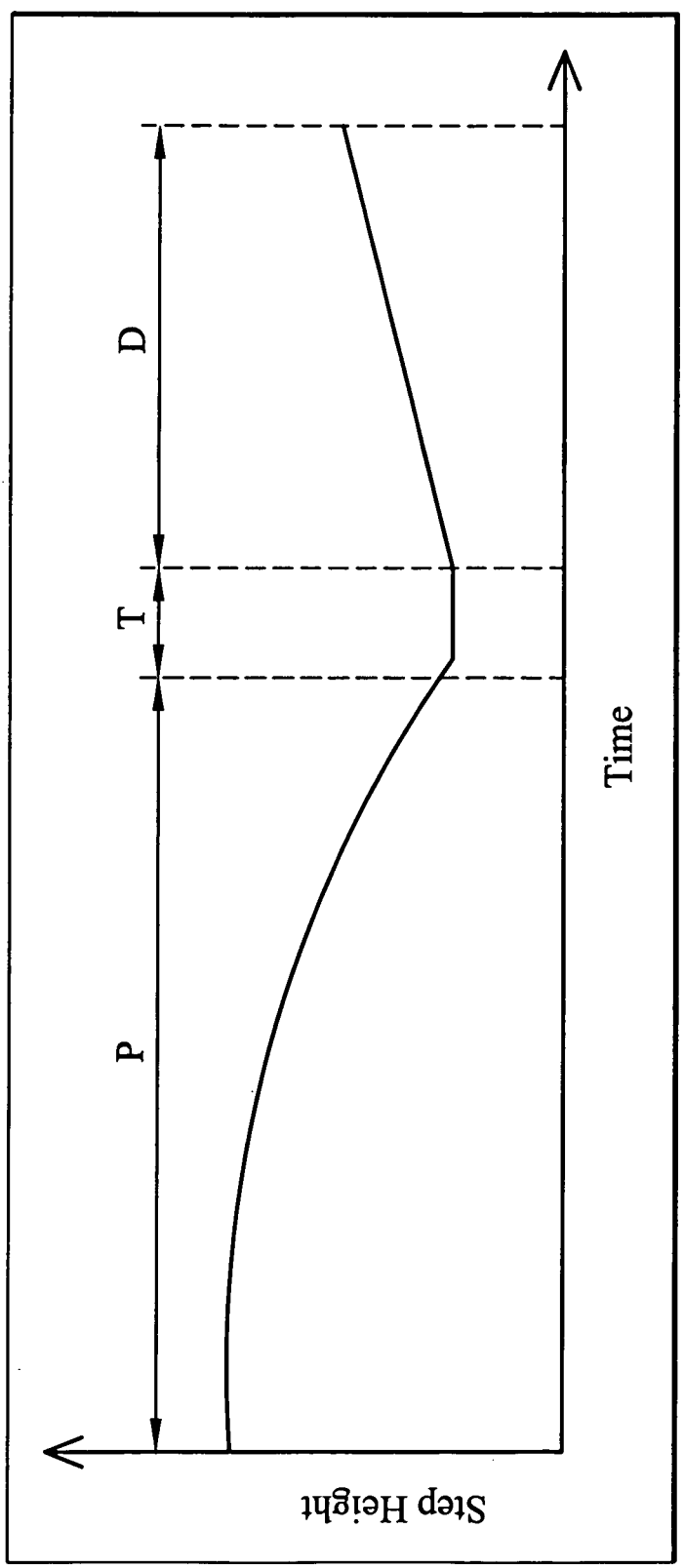
FIG. 2a is a schematic diagram showing the step height against the time during a conventional CMP process according to the prior art.
Figure 2B:
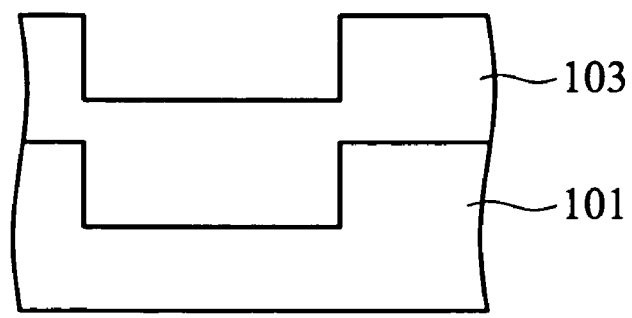
FIG. 2b shows schematic cross-section profiles of the corresponding substrate at the beginning of the planarization stage.
Figure 2C:
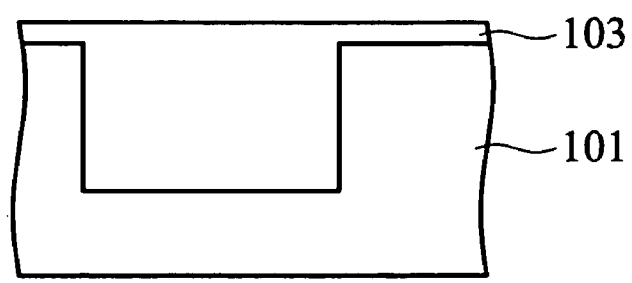
FIG. 2c shows schematic cross-section profiles of is the corresponding substrate near the beginning of the transition stage.
Figure 2D:
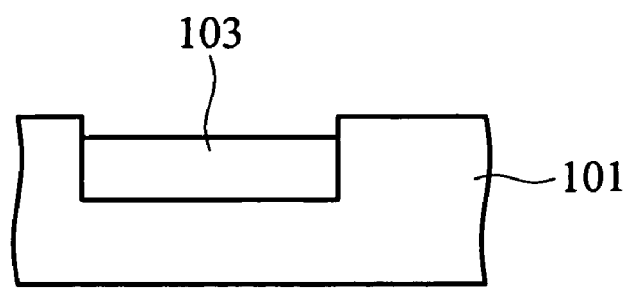
FIG. 2d shows schematic cross-section profiles of the corresponding substrate at the end point of the polishing.

Referring to FIG. 1, a patterned silicon dioxide layer 101 with trench patterns of squares (110×110 µm$^2$) and isolated lines (5×350 µm$^2$) formed on a substrate, a TiN barrier layer 102 of 250 Å±50 Å formed conformally to cover the surface of the top, side wall and bottom of the patterned silicon dioxide layer 101 to prevent diffusion of cu following deposition, and a copper layer 103 formed on the TiN barrier layer 102 and filling the opening on the TiN barrier layer 102 were provided using the same method as used in the example mentioned above. The copper layer had a thickness and average step heights the same as those described in the example.

The copper layer 103 was subjected to the same CMP process as used in the example, but only one CMP process was performed. The CMP process was stopped only when the end-point was detected by the polishing machine. As a result, the dishing phenomenon caused by the pattern effect in the CMP process was serious and the average step heights were about 1600 Å for the square area and about 500 Å for the isolated line area.

Example 2

The Method of Eliminating the Dishing Phenomena after a CMP Process According to the Present Invention A semiconductor substrate with dishing phenomena after a CMP process was provided. The semiconductor substrate contained a patterned dielectric layer, a TiN barrier layer with a thickness of 250 Å±50 Å, an end-point-polished copper layer with a dishing depth of about 1200 Å at the trench pattern. A layer of copper was electrochemically plated on the polished copper layer, resulting a copper layer with a total thickness (from the top surface of the barrier layer to the top surface of the copper layer) of about 6000 Å. Then, a CMP process was performed. At the end of the CMP process, a planar surface of the copper layer was obtained.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art) Therefore, the scope of the appended claims should be accorded the broadest interpretation so as to encompass all such modifications and similar arrangements.

What is claimed is:

1. A CMP rework method, comprising steps of:
providing a semiconductor substrate which has a patterned dielectric layer comprising an opening and a horizontal top surface, a barrier layer over the patterned dielectric layer, and a conductive layer over the barrier layer the opening and the horizontal top surface of;
performing a first CMP process to remove part of the conductive layer, wherein the barrier layer over the opening and the horizontal top surface of the patterned dielectric layer is totally not exposed after the first CMP process;
after the first CMP process depositing a layer of material substantially the same as the conductive layer over the conductive layer and the barrier layer; and
after the depositing performing a second CMP process to expose the patterned dielectric layer.

2. The method as claimed in claim 1, wherein the conductive layer comprises copper or copper alloy.

3. The method as claimed in claim 1, wherein the dielectric layer comprises silicon dioxide, silicon nitride, phosphosilicate glass, borophosphosilicate glass, or fluorosilicate glass.

4. The method as claimed in claim 1, wherein the barrier layer comprises Ta, Ti, TaN, TiN, or WN.

5. The method as claimed in claim 2, wherein the deposition of copper or copper alloy is performed using electroplating, CVD, or PVD.

6. The method as claimed in claim 1, wherein the top surface of the layer deposited in said step of depositing said layer of material substantially the same as the conductive layer over the conductive layer is higher than the barrier layer.

7. The method as claimed in claim 1, wherein the semiconductor substrate is reported by a CMP machine as an abnormally polished wafer at a predetermined CMP end point after performing said first CMP process to remove part of the conductive layer.

* * * * *